(12) United States Patent
Choi et al.

(10) Patent No.: US 8,598,582 B2
(45) Date of Patent: Dec. 3, 2013

(54) ORGANIC LIGHT EMITTING DISPLAY DEVICE

(75) Inventors: Jun-Ho Choi, Yongin (KR); Jin-Koo Chung, Yongin (KR); Seong-Min Kim, Yongin (KR)

(73) Assignee: Samsung Display, Yongin, Gyeonggi-Do (KR)

( * ) Notice: Subject to any disclaimer, the term of this patent is extended or adjusted under 35 U.S.C. 154(b) by 175 days.

(21) Appl. No.: 13/067,442

(22) Filed: Jun. 1, 2011

(65) Prior Publication Data

US 2012/0080680 A1    Apr. 5, 2012

(30) Foreign Application Priority Data

Oct. 4, 2010    (KR) .......................... 10-2010-0096513

(51) Int. Cl.
*H01L 29/04*    (2006.01)

(52) U.S. Cl.
USPC   257/59; 257/72; 257/E33.001; 257/E33.003; 257/E33.004

(58) Field of Classification Search
USPC ........ 257/59, 72, E33.001, E33.003, E33.004
See application file for complete search history.

(56) References Cited

U.S. PATENT DOCUMENTS

| 5,739,545 A | 4/1998 | Guha et al. |
| 2005/0082967 A1 | 4/2005 | Ryu |
| 2005/0146658 A1 | 7/2005 | Kim et al. |
| 2005/0237455 A1 | 10/2005 | Fujioka et al. |
| 2007/0152222 A1* | 7/2007 | Joo .................................. 257/72 |
| 2009/0066236 A1* | 3/2009 | Sung et al. .................... 313/504 |
| 2010/0102320 A1* | 4/2010 | Chung et al. .................... 257/59 |

FOREIGN PATENT DOCUMENTS

| JP | 2005-331926 A | 2/2005 |
| KR | 10-1998-0069980 A | 10/1998 |
| KR | 10-2005-0025509 A | 3/2005 |
| KR | 10-2005-0072310 A | 7/2005 |
| KR | 10-2007-0034769 A | 3/2007 |

* cited by examiner

*Primary Examiner* — Timor Karimy
(74) *Attorney, Agent, or Firm* — Lee & Morse, P.C.

(57) ABSTRACT

An organic light emitting display device includes a substrate, a plurality of unit pixels on the substrate, each unit pixel including a first region that emits light and a second region that transmits external light, thin film transistors (TFTs) disposed in the first region of each unit pixel, first electrodes disposed in the first region of each unit pixel, each first electrode being electrically connected to one of the TFTs, a second electrode facing the first electrodes, and commonly disposed in the unit pixels, and an organic layer interposed between the first electrodes and the second electrode, and including an emissive layer. With respect to two adjacent pixels of the plurality of unit pixels, the first region and the second region in one unit pixel are symmetrical with the first region and the second region in another adjacent unit pixel, and the second regions are connected to each other.

19 Claims, 7 Drawing Sheets

ORGANIC LIGHT EMITTING DISPLAY DEVICE

BACKGROUND

1. Field

Embodiments relate to an organic light emitting display device.

2. Description of the Related Art

Organic light emitting display devices have been increasingly used from personal portable devices such as MP3 players, and cellular phones, to televisions (TVs) due to excellence in terms of viewing angle, contrast, response speed, power consumption, etc.

Since organic light emitting display devices are self-emissive, separate light sources are not required (unlike liquid crystal display devices), thereby reducing their thickness and weight.

An organic light emitting display device may be transparent by using a transparent thin film transistor (TFT) and a transparent organic light emitting device (OLED).

SUMMARY

According to an embodiment, there is provided an organic light emitting display device including a substrate, a plurality of unit pixels on the substrate, each unit pixel including a first region that emits light and a second region that transmits external light, and wherein, with respect to two adjacent pixels of the plurality of unit pixels, the first region and the second region in one unit pixel are symmetrical with the first region and the second region in another adjacent unit pixel, and the second regions are connected to each other, a plurality of thin film transistors (TFTs) disposed in the first region of each unit pixel, a plurality of first electrodes disposed in the first region of each unit pixel, each first electrode being electrically connected to one of the TFTs, a second electrode facing the plurality of first electrodes and commonly disposed in the unit pixels, and an organic layer interposed between the first electrodes and the second electrode, and including an emissive layer.

With respect to four adjacent unit pixels of the plurality of unit pixels, the first region and the second region in one pixel may be symmetrical with the first region and the second region in another adjacent unit pixel.

With respect to a 2×2 array of four unit pixels of the plurality of unit pixels, the first region and the second region in one unit pixel may be symmetrical with the first region and the second region in an adjacent unit pixel, and the second regions of the four unit pixels are connected to each other.

The second electrode may include a light-reflective material.

The second electrode may include a transmissive window that is formed by exposing a portion of the second electrode corresponding to the second region.

The transmissive window of one unit pixel may be connected to the transmissive window of another adjacent unit pixel.

With respect to four adjacent unit pixels of the plurality of unit pixels, the transmissive window of one unit pixel may be connected to the transmissive window of another adjacent pixel.

Each of the first electrodes may include a light-transmissive material.

Each of the TFTs may overlap one of the first electrodes.

The first region of each unit pixel may include an emissive region and a circuit region. Each of the TFTs may be disposed in the circuit region of a corresponding unit pixel. Each of the first electrodes may be disposed in the emissive region of a corresponding unit pixel.

The emissive region and the circuit region of each unit pixel may be adjacent to each other.

The organic light emitting display device may further include a wiring portion electrically connecting the emissive region and the circuit region, wherein the wiring portion may be disposed outside an edge portion of the second region.

The organic light emitting display device may further include a passivation layer covering the TFTs, and a pixel definition layer formed on the passivation layer and covering edge portions of the first electrodes.

The pixel definition layer may include an opening with respect to each unit pixel, the opening corresponding to the second region.

The opening of the pixel definition layer of one unit pixel may be connected to the opening of the pixel definition layer of another adjacent unit pixel.

With respect to four adjacent unit pixels of the plurality of unit pixels, the opening of the pixel definition layer of one unit pixel may be connected to the opening of the pixel definition layer of another adjacent unit pixel.

The passivation layer may include an opening with respect to each unit pixel, the opening corresponding to the second region.

The organic light emitting display device may further include a buffer layer formed on the substrate.

The buffer layer may include an opening with respect to each unit pixel, the opening corresponding to the second region.

BRIEF DESCRIPTION OF THE DRAWINGS

The features and advantages will become more apparent to those of skill in the art by describing in detail example embodiments with reference to the attached drawings, in which.

DETAILED DESCRIPTION

Figure 1:
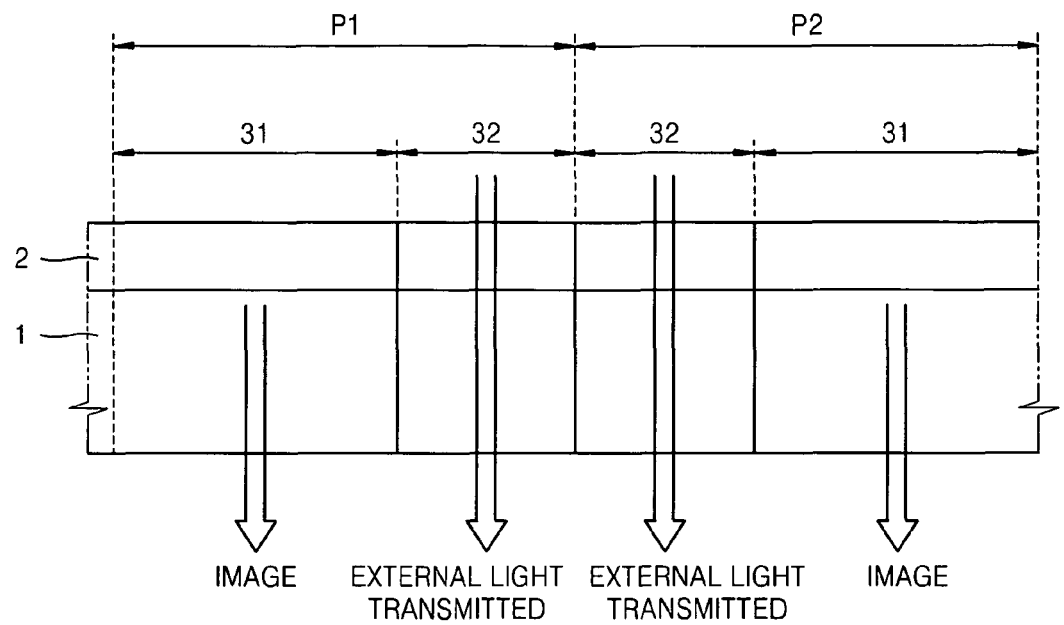
FIG. 1 illustrates a cross-sectional view of an organic light emitting display device according to an embodiment.

Korean Patent Application No. 10-2010-0096513, filed on Oct. 4, 2010, in the Korean Intellectual Property Office, and entitled: "Organic Light Emitting Display Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of an organic light emitting display device according to an embodiment.

Referring to FIG. 1, the organic light emitting display device according to the present embodiment includes a display portion 2 formed on a substrate 1.

In the organic light emitting display device, external light is incident through the substrate 1 and the display portion 2.

The display portion 2 is configured so that the external light may be transmitted therethrough, as will be described below. In FIG. 1, the display portion 2 is configured so that a user at a side towards which an image is realized may view an object image from an opposite side of the display portion 2.

FIG. 1 shows a first unit pixel P1 and a second unit pixel P2 that are two adjacent unit pixels of the organic light emitting display device. Each of the first unit pixel P1 and the second unit pixel P2 includes a first region 31 and a second region 32.

The image is realized on the display portion 2 through the first region 31 of each of the first unit pixel P1 and the second unit pixel P2. External light is transmitted through the second region 32 of each of the first unit pixel P1 and the second unit pixel P2.

According to the present embodiment, both the first unit pixel P1 and the second unit pixel P2 may include the first region 31 for realizing the image, and the second region 32 for transmitting the external light, and thus the user may view the object image at the opposite side of the display portion 2 when the user does not want to view the image.

Elements such as a thin film transistor (TFT), a capacitor, an organic light emitting device (OLED), or the like, may be omitted from the second region 32, and thus, the transmittance of the organic light emitting display device may be maximized. In addition, distortion of a transmitted image due to interference by the devices such as the TFT, the capacitor, the OLED, or the like, may be prevented.

Figure 3:
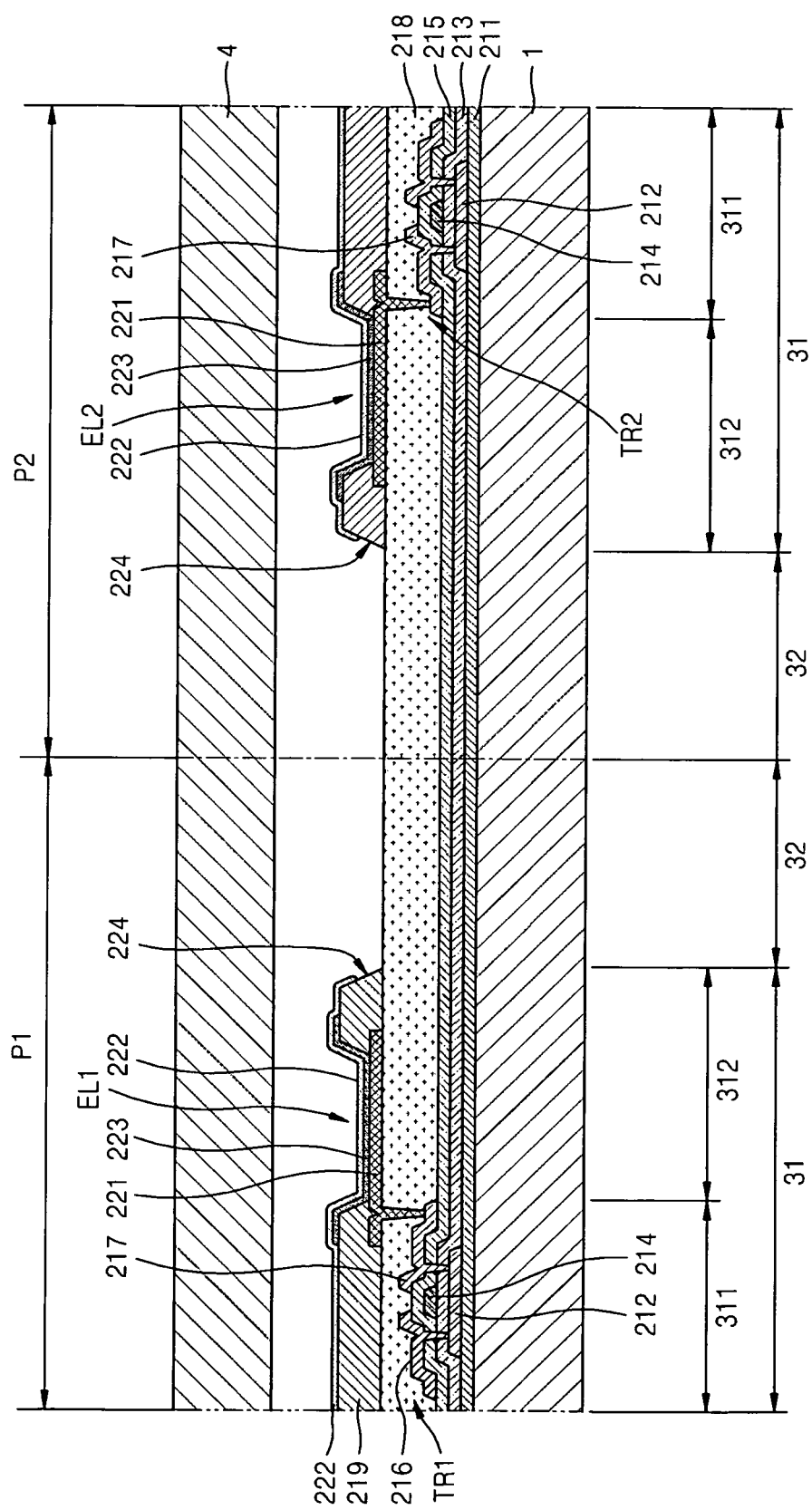
FIG. 3 illustrates a cross-sectional view of two adjacent unit pixels in the organic light emitting display device of FIG. 1.
Figure 6:
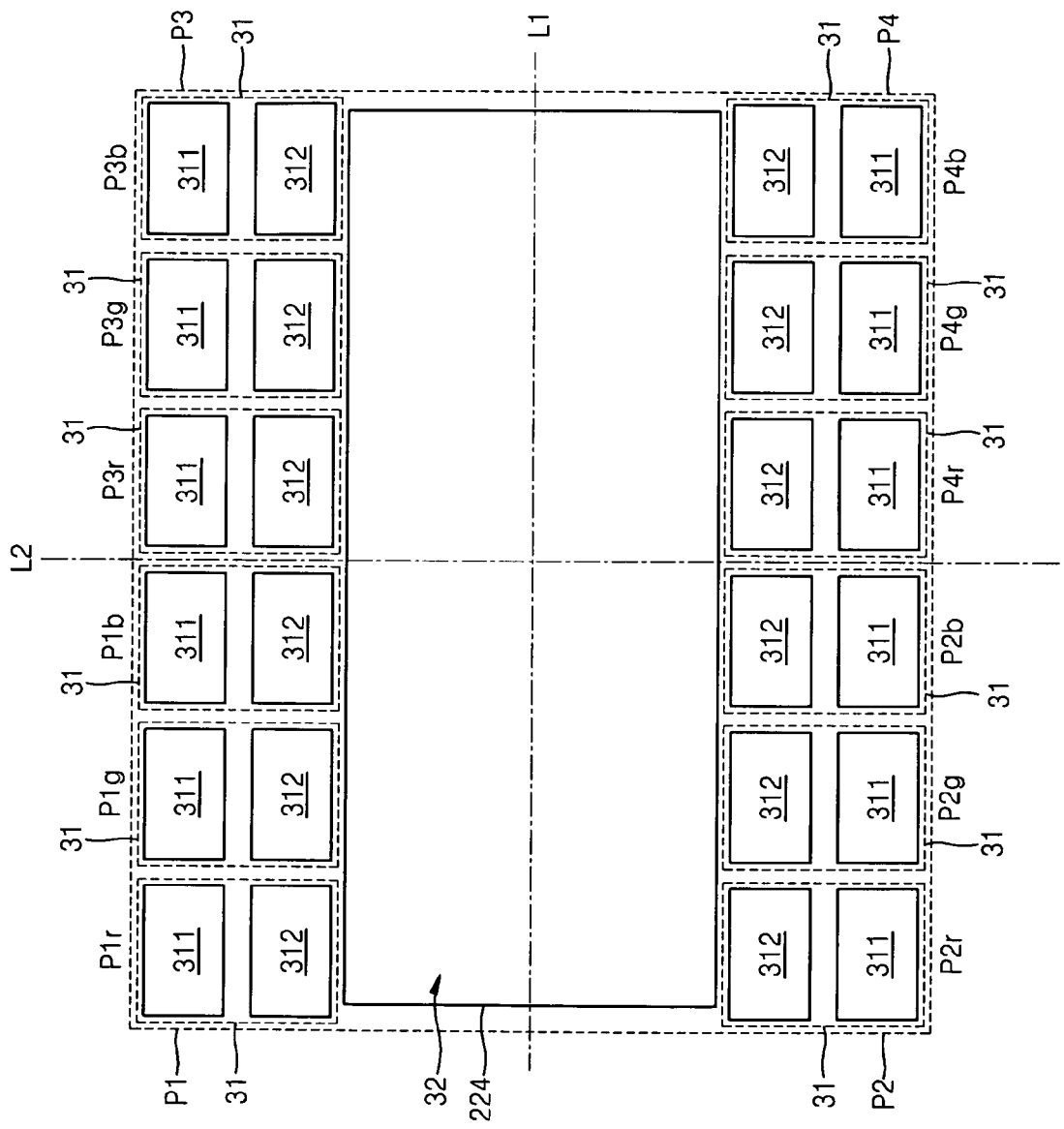
FIG. 6 illustrates a plan view of an organic light emitting display device according to another embodiment.

According to the present embodiment, the first region 31 and the second region 32 of the first unit pixel P1 are formed to be symmetric with the first region 31 and the second region 32 of the second unit pixel P2, the second unit pixel P2 being adjacent to the first unit pixel P1. With respect to adjacent unit pixels, the statement that "the first region 31 and the second region 32 of the first unit pixel P1 are formed to be symmetric with the first region 31 and the second region 32 of the second unit pixel P2" may refer to a configuration in which a second region 32 of the first unit pixel P1 is connected to a second region 32 of a second unit pixel P2 at a boundary L1, and the first regions of the adjacent unit pixels P1 and P2 are on opposite sides of the respective second regions, as shown, for example, in FIG. 1. Moreover, the statement may also refer to the configuration in which the first region 31 of a first unit pixel P1 is connected to a first region 31 of an adjacent unit pixel P3 and a second region 32 of the first unit pixel P1 is connected to a second region 32 of the adjacent unit pixel at a boundary L2 as shown in FIG. 6. Moreover, although not required in all aspects, adjacent pixels may be mirror images of each other along a common boundary or mid-point between the adjacent pixels. Also, although not required in all aspects, individual components of the adjacent pixels, such as circuit regions 311 and emissive regions 312, may be symmetric with respect to the common boundary or mid-point as shown in FIG. 3.

The second region 32 of the first unit pixel P1 may be connected to the second region 32 of the second unit pixel P2. Thus, an area for transmitting the external light is increased, the transmittance of the organic light emitting display device may be maximized, and the transmitted image may be further prevented from being distorted.

Figure 2:
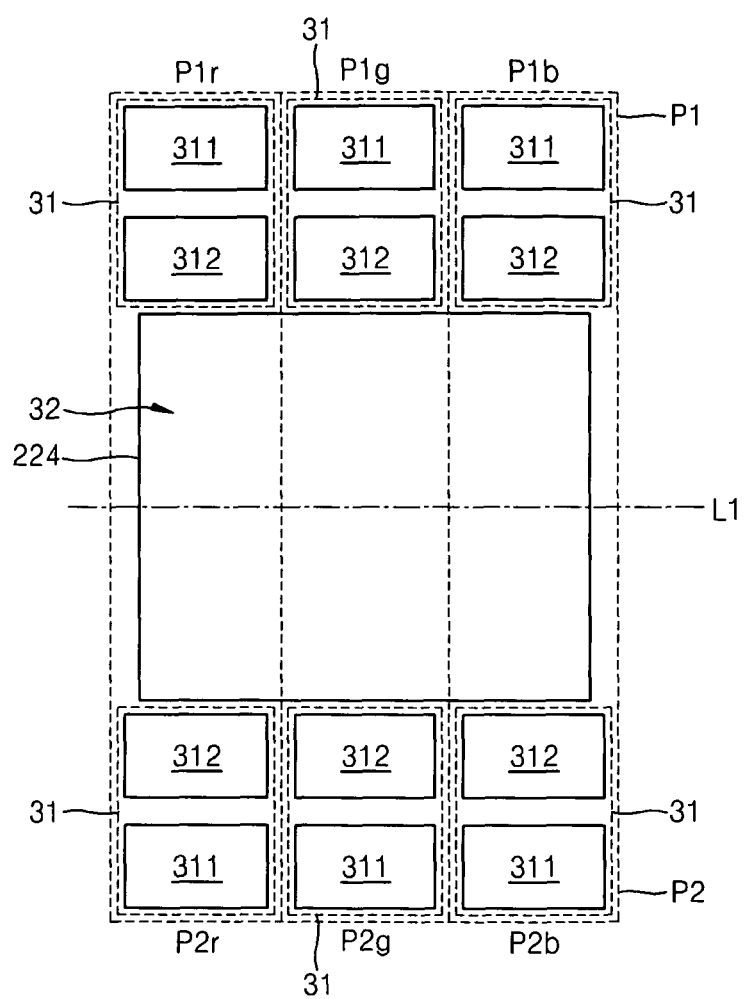
FIG. 2 illustrates a plan view of the organic light emitting display device of FIG. 1.

FIG. 2 illustrates a plan view of the first unit pixel P1 (including a red sub pixel P1r, a green sub pixel P1g, and a blue sub pixel P1b) and the second unit pixel P2 (including a red sub pixel P2r, a green sub pixel P2g, and a blue sub pixel P2b) according to an embodiment.

Each of the red sub pixel P1r, the green sub pixel P1g, and the blue sub pixel P1b may include a circuit region 311 and an emissive region 312 that are formed on the first region 31. The circuit region 311 and the emissive region 312 may be arranged adjacent to each other.

Each of the red sub pixel P2r, the green sub pixel P2g, and the blue sub pixel P2b may include a circuit region 311 and an emissive region 312 that are formed on the first region 31. The circuit region 311 and the emissive region 312 may be arranged adjacent to each other.

In the example embodiment illustrated in FIGS. 1 and 2, the first region 31 and the second region 32 of the first unit pixel P1 may be formed to be symmetric with the first region 31 and the second region 32 of the second unit pixel P2, which is adjacent to the first unit pixel P1. Thus, the first region 31 and the second region 32 of the first unit pixel P1 may be symmetric with the first region 31 and the second region 32 of the second unit pixel P2, based on a line L1. Moreover, as shown in FIG. 2, a portion of a first region 31 and second region 32 in a sub pixel may be symmetric with a portion of a first region 31 and second region 32 of an adjacent sub pixel.

Thus, in the example embodiment illustrated in FIGS. 1 and 2, the second regions 32 are consecutively arranged across the first unit pixel P1 and the second unit pixel P2 so that an area for transmitting the external light may be increased. The first regions 31 may be arranged at an equal distance from the line L1 between the pixels.

Figure 4:
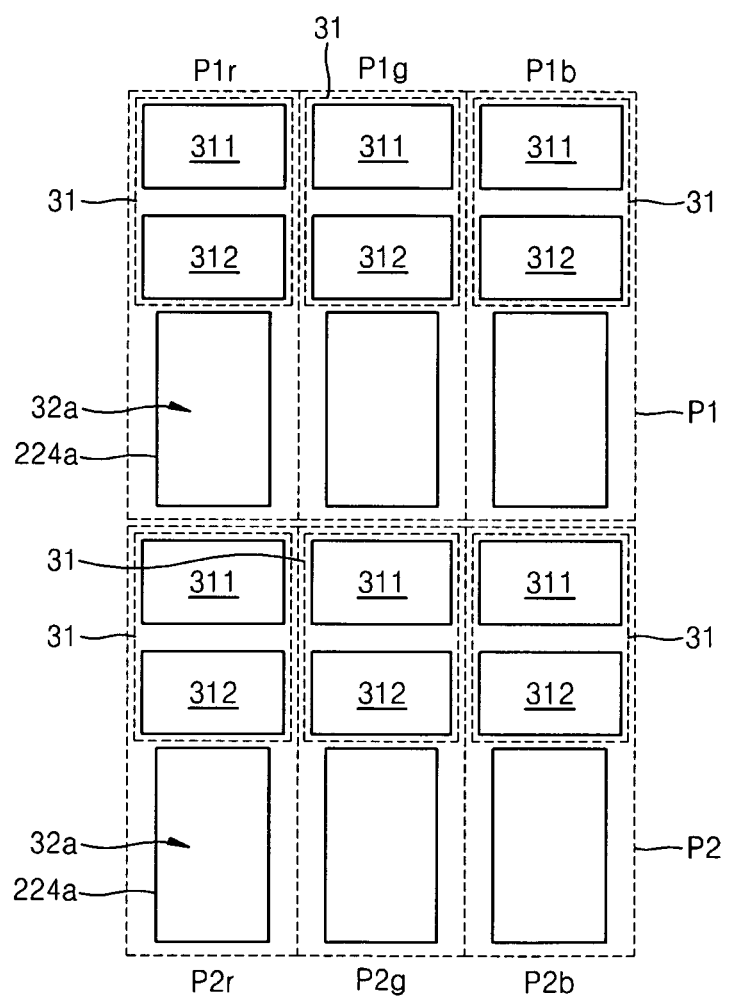
FIGS. 4 and 5 illustrate plan views of organic light emitting display devices as comparative examples.

An organic light emitting display device illustrated in FIG. 4 is a comparative example. In FIG. 4, respective second regions 32a are separately provided for the red sub pixel P1r, the green sub pixel P1g, and the blue sub pixel P1b, or the red sub pixel P2r, the green sub pixel P2g, and the blue sub pixel P2b. Moreover, the respective second regions 32a of one pixel are not connected with second regions 32a of an adjacent pixel. In addition, in an organic light emitting display device illustrated in FIG. 5, which is another comparative example, respective second regions 32b are provided for the first unit pixel P1 and the second unit pixel P2. The respective second regions 32b of one pixel P1 are not connected with second regions 32a of the adjacent pixel P2.

Figure 5:
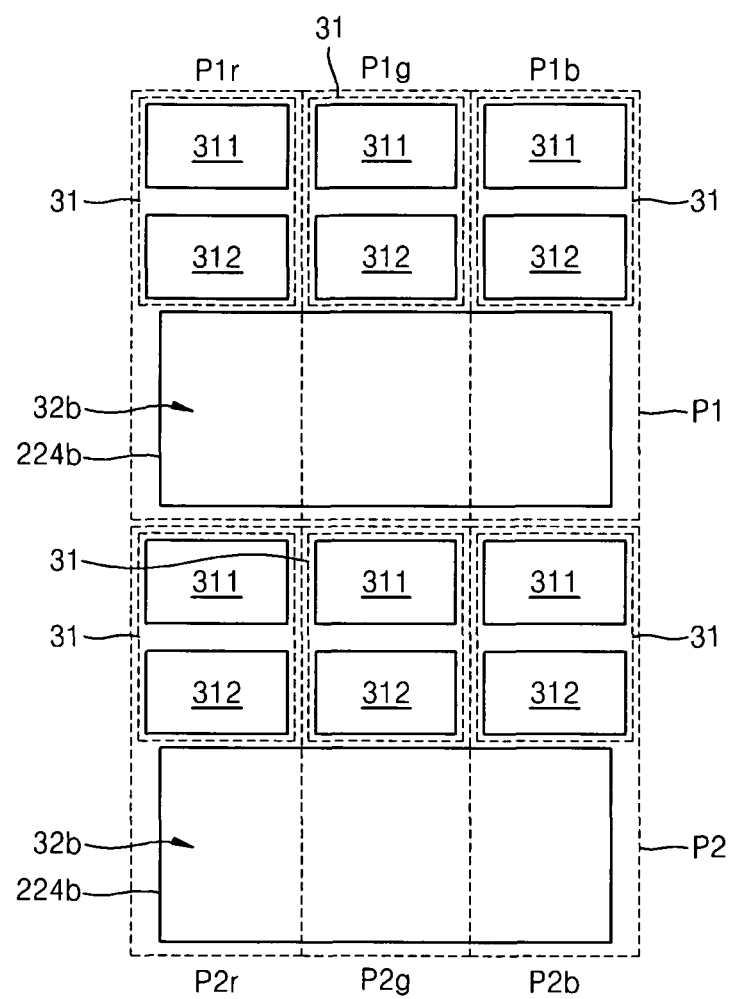

In the organic light emitting display device of FIG. 1, an area for transmitting the external light may be maximized, transmittance may be increased, and the transmitted image may be prevented from being distorted, as compared to the organic light emitting display devices of FIGS. 4 and 5.

FIG. 3 illustrates a cross-sectional view of the first unit pixel P1 and the second unit pixel P2 of FIGS. 1 and 2, which are adjacent to each other.

Referring to FIG. 3, TFTs TR1 and TR2 may be disposed in the circuit regions 311 of the first unit pixel P1 and the second unit pixel P2, respectively. In FIG. 3, a single TFT may be disposed in each of the first unit pixel P1 and the second unit pixel P2, but the present embodiment is not limited thereto. The first unit pixel P1 and the second unit pixel P2 may include respective pixel circuits including the TFTs TR1 and TR2.

The pixel circuit may include a plurality of TFTs and a storage capacitor in addition to the TFT TR1 or TR2 and may further include a scan line, a data line, a Vdd line, and the like, which are connected to the TFTs and the storage capacitor. The scan line, the data line, and the Vdd line, and the like may be disposed outside the second region 32 for transmitting the external light.

In FIG. 3, OLEDs EL1 and EL2 may be respectively disposed in the emissive regions 312 of the first unit pixel P1 and the second unit pixel P2. The OLEDs EL1 and EL2 are electrically connected to the TFTs TR1 and TR2 of the pixel circuits, respectively.

As illustrated in FIG. 3, a buffer layer 211 may be formed on the substrate 1, and the circuits including the TFTs TR1 and TR2 may be formed on the buffer layer 211.

In an embodiment, a semiconductor active layer 212 may first be formed on the buffer layer 211.

The buffer layer 211 may make the substrate 1 smooth, may prevent the penetration of impurities, and may be formed of various materials for performing these functions. For example, the buffer layer 211 may be formed of an inorganic material such as a silicon oxide, a silicon nitride, a silicon oxynitride, an aluminum oxide, an aluminum nitride, a titanium oxide, or a titanium nitride, formed of an organic material such as polyimide, polyester, or acryl, or formed of a stack structure thereof. In other embodiments, the buffer layer 211 may be omitted.

The semiconductor active layer 212 may be formed of, e.g., poly-crystalline silicon, an oxide semiconductor, etc. For example, the semiconductor active layer 212 may include an oxide semiconductor such as a G-I-Z-O layer [$(In_2O_3)_a (Ga_2O_3)_b (ZnO)_c$ layer] (a, b, and c are real numbers satisfying a≥0, b≥0, and c>0, respectively). When the semiconductor active layer 212 is formed of an oxide semiconductor, the transmittance of the semiconductor active layer 212 may be increased, and thus the transmittance of the display portion 2 may be increased.

A gate insulating layer 213 may be formed on the buffer layer 211 so as to cover the semiconductor active layer 212, and a gate electrode 214 may be formed on the gate insulating layer 213.

An interlayer insulating layer 215 may be formed on the gate insulating layer 213 so as to cover the gate electrode 214, and a source electrode 216 and a drain electrode 217 may be formed on the interlayer insulating layer 215 so as to be connected to the semiconductor active layer 212 through contact holes.

The structures of the TFTs TR1 and TR2 are not limited to FIG. 3, and TFTs having various structures may be used.

A passivation layer 218 may be formed so as to cover the TFTs TR1 and TR2. The passivation layer 218 may include a single layer or a plurality of insulating layers whose upper surface is planarized. The passivation layer 218 may be formed of an organic material and/or an organic material.

First electrodes 221 of the OLEDs EL1 and EL2, electrically connected to the TFTs TR1 and TR2 disposed in the first unit pixel P1 and the second unit pixel P2, may be respectively formed on the passivation layer 218. The first electrodes 221 may be formed in island forms that are separated from each other for respective pixels.

A pixel definition layer 219 formed of an organic insulating material and/or an inorganic insulating material may be formed on the passivation layer 218.

The pixel definition layer 219 may cover edge portions of the first electrodes 221, and expose a central portion of the first electrodes 221. The pixel definition layer 219 may be disposed so as to cover the first regions 31. The pixel definition layer 219 may be disposed as to not cover an entire surface of the first regions 31. For example, the pixel definition layer 219 may cover at least a portion of the first regions 31, in particular, edge portions of the first electrodes 221.

In the example embodiment illustrated in FIG. 3, the pixel definition layer 219 may include an opening corresponding to the second region 32 of each of the first unit pixel P1 and the second unit pixel P2. For example, the opening of the pixel definition layer 219 of the first unit pixel P1 may be connected to the opening of the pixel definition layer 219 of the second unit pixel P2, adjacent to the first unit pixel P1. As described below, the opening may be formed to correspond to a transmissive window 224 formed in a second electrode 222. According to the present embodiment, the pixel definition layer 219 may include the opening corresponding to the second region 32, but the present embodiment is not limited thereto. For example, if the pixel definition layer 219 has predetermined transmittance, the opening may be omitted, and a portion of the pixel definition layer 219 corresponding to the second region 32 may be formed to be thin by engraving or etching the portion of the pixel definition layer 219 corresponding to the second region 32.

An organic layer 223 and the second electrode 222 may be sequentially stacked on the first electrode 221. The second electrode 222 may cover the organic layer 223 and the pixel definition layer 219. The second electrode 222 may be electrically connected across all pixels.

The organic layer 223 may include a low molecular weight organic layer or a high molecular weight organic film. When including a low molecular weight organic layer, the organic layer 223 may have a single or multi-layer structure including at least one of a hole injection layer (HIL), a hole transport layer (HTL), an organic emission layer (EML), an electron transport layer (ETL), and an electron injection layer (EIL). Examples of suitable organic materials may include copper phthalocyanine (CuPc), N,N'-di(naphthalene-1-yl)-N,N'-diphenyl-benzidine (NPB), tris-8-hydroxyquinoline aluminum (Alq3), and the like. The low molecular weight organic layer may be formed by vacuum deposition. EMLs may be separately formed in respective red, green and blue pixels. The HIL, the HTL, ETL, and the EIL may be common layers, e.g., they may be commonly formed in the red, green and blue pixels.

The first electrode 221 may function as an anode, and the second electrode 222 may function as a cathode. Alternatively, the first electrode 221 may function as a cathode, and the second electrode 222 may function as an anode.

The first electrode 221 may be formed as a transparent electrode, and the second electrode 222 may be formed as a reflective electrode. The first electrode 221 may be formed of indium tin oxide (ITO), indium zinc oxide (IZO), zinc oxide (ZnO), or indium oxide ($In_2O_3$). The second electrode 222 may be formed of a metal having a low work function, such silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Accordingly, the OLEDs EL1 and EL2 may each be a bottom emission type OLED for realizing an image towards the first electrode 221. In another implementation, the first electrode 221 may be formed as a reflective electrode, and the second electrode 222 may be formed as a transparent electrode.

In an embodiment, the passivation layer 218 may be formed as a transparent insulating layer. When the passivation layer 218 is transparent, a separate opening of the passivation layer 218 corresponding to the second region 32 may be omitted (see FIG. 3). In order to more effectively transmit the external light, the opening of the passivation layer 218 corresponding to the second region 32 may be formed. In this case, the passivation layer 218 may be formed of a wider variety of materials, including those having low transmittance.

The buffer layer 211, the gate insulating layer 213, and the interlayer insulating layer 215 may each be formed of a transparent insulating layer. In another implementation, in order to more effectively transmit the external light, openings may be formed in portions corresponding to the second region 32. In this case, the buffer layer 211, the gate insulating layer 213, and the interlayer insulating layer 215 may each be formed of a wider variety of materials, including those having low transmittance.

A sealing substrate 4 may be disposed on the second electrode 222. The sealing substrate 4 may be adhered to the substrate 1 by a separate sealant (not shown) in edge portions of the display portion 2 so as to seal the display portion 2 from the outside air.

A filler (not shown), or a water vapor absorption material may be filled between the sealing substrate 4 and the second electrode 222. The present embodiment is not limited to the case where the display portion 2 is sealed using the sealing substrate 4. For example, a sealing structure of a film type may be used.

According to the present embodiment, the transmissive window 224 may be further formed in the second electrode 222 and the pixel definition layer 219. However, the present embodiment is not limited thereto. As long as the second region 32 transmits the external light therethrough, when the second electrode 222 that is transparent is formed to be thin, as described above, separate patterning for forming a transmissive window in the second electrode 222 may be omitted. In addition, when the second electrode 222 that is transparent is formed to have a predetermined thickness, a portion of the second electrode 222 corresponding to the transmissive window 224 may be formed to be thin by engraving the portion of the second electrode 222 corresponding to the transmissive window 224.

The transmissive window 224 is formed so as to correspond to the second region 32 of each of the first unit pixel P1 and the second unit pixel P2. According to the present embodiment, the transmissive window 224 may be formed so as to expose the second electrode 222 and the pixel definition layer 219, as illustrated in FIG. 3. That is, the transmissive window 224 of the first unit pixel P1 may be connected to the transmissive window 224 of the second unit pixel P2 adjacent to the first unit pixel P1. Thus, an area for transmitting the external light and transmittance may be further increased, and the transmitted image may be prevented from being distorted.

FIG. 6 is a plan view of an organic light emitting display device according to another embodiment of the present invention, and shows a first unit pixel P1, a second unit pixel P2, a third unit pixel P3, and a fourth unit pixel P4, which may be arranged as a 2×2 array.

The first through fourth unit pixels P1, P2, P3 and P4 include the red sub pixel P1r, P2r, P3r, and P4r, the green sub pixel P1g, P2g, P3g, and P4g, and the blue sub pixel P1b, P2b, P3b, and P4b, respectively. Each of the red sub pixel P1r, P2r, P3r, and P4r, the green sub pixel P1g, P2g, P3g, and P4g, and the blue sub pixel P1b, P2b, P3b, and P4b includes the circuit region 311 and the emissive region 312 that are disposed in the first region 31. The circuit region 311 and the emissive region 312 are adjacent to each other.

The first region 31 and the second region 32 are formed to be symmetric with the first region 31 and the second region 32 between the first, second, third, and fourth unit pixels P1, P2, P3, and P4. That is, the first region 31 and the second region 32 are formed to be symmetric with the first region 31 and the second region 32, based on lines L1 and L2.

As a result, the second regions 32 are consecutively arranged across the first, second, third, and fourth unit pixels P1, P2, P3, and P4 so that an area for transmitting the external light may be increased by two times an area in the above-described case of FIG. 2.

Thus, in the organic light emitting display device according to the present embodiment, since transmittance of the organic light emitting display device may be maximized, and the transmitted image may be prevented from being distorted.

Figure 7:
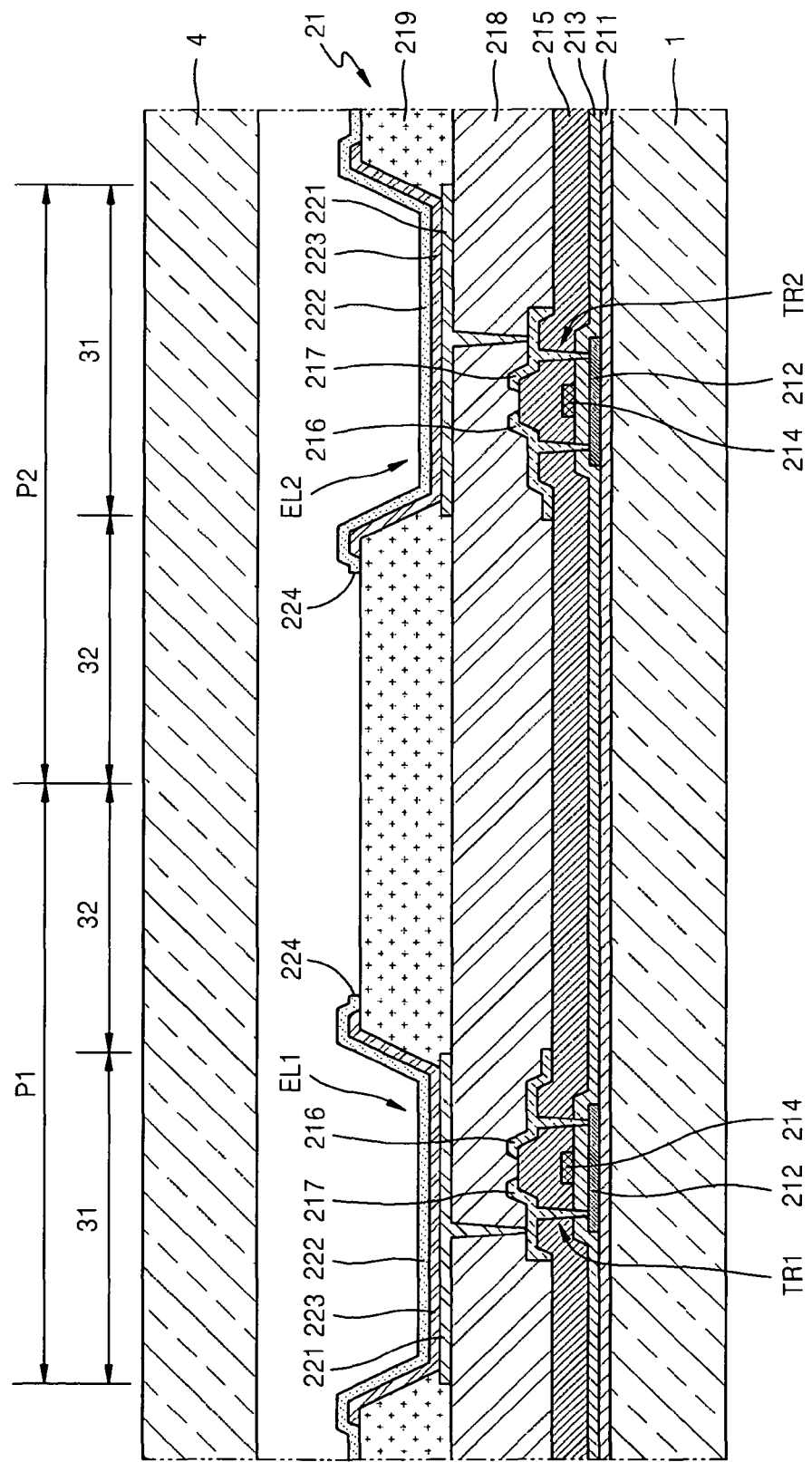
FIG. 7 illustrates a cross-sectional view of two adjacent unit pixels in the organic light emitting display device of FIG. 6.

The above-described embodiments of the present invention may be applied to the structure in which the circuit portion including the TFTs TR1 and TR2 overlaps the first electrode 221, as illustrated in FIG. 7, as well as to the structure in which the circuit portion including the TFTs TR1 and TR2 does not overlap the first electrode 221, as illustrated in FIG. 3.

In FIG. 7, when the first electrode 221 is formed as a reflective electrode, conductive patterns of the circuit portion are screened by the first electrode 221, the external light may be prevented from being scattered by the conductive patterns of the circuit portion, thereby preventing the transmitted image from being distorted.

As described above, according to the above embodiments of the present invention, an area of the second region 32 is maximized, and thus transmittance in the second region 32 may be prevented from being lowered. In addition, the external light may be prevented from being scattered by the conductive patterns of the circuit portion, thereby preventing the transmitted image from being distorted.

One or more embodiments may help to circumvent a condition in which high transmittance through a transparent OLED display device is hindered by the presence of OLEDs, TFTs and wirings. When a transparent display device is powered off, an image of an object opposite is transmitted to a user through TFTs, patterns of various wirings, and spaces therebetween as well as through OLEDs. Since the transmittances of OLEDs, TFTs, and wirings are not relatively high, and spaces between them are very small, even the transparent display device may not have high transmittance.

One or more aspects of the present invention provide transparent organic light emitting display devices having high transmittance, which prevent light from being scattered, thereby preventing an transmitted image from being distorted.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting display device comprising:
a substrate;
a plurality of unit pixels on the substrate, each unit pixel including a first region that emits light and a second region that transmits external light, and wherein, with respect to two adjacent pixels of the plurality of unit pixels, the first region and the second region in one unit pixel are symmetrical with the first region and the second region in another adjacent unit pixel, and the second regions are connected to each other;

a plurality of thin film transistors (TFTs) disposed in the first region of each unit pixel;

a plurality of first electrodes disposed in the first region of each unit pixel, each first electrode being electrically connected to one of the TFTs;

a second electrode facing the plurality of first electrodes and commonly disposed in the unit pixels; and an organic layer interposed between the first electrodes and the second electrode, and including an emissive layer.

2. The organic light emitting display device as claimed in claim 1, wherein, with respect to four adjacent unit pixels of the plurality of unit pixels, the first region and the second region in one unit pixel are symmetrical with the first region and the second region in another adjacent unit pixel.

3. The organic light emitting display device as claimed in claim 1, wherein, with respect to a 2×2 array of four unit pixels of the plurality of unit pixels, the first region and the second region in a unit pixel are symmetrical with the first region and the second region in an adjacent unit pixel, and the second regions of the four unit pixels are connected to each other.

4. The organic light emitting display device as claimed in claim 1, wherein the second electrode includes a light-reflective material.

5. The organic light emitting display device as claimed in claim 4, wherein each of the first electrodes includes a light-transmissive material.

6. The organic light emitting display device as claimed in claim 1, wherein the second electrode includes a transmissive window that is formed by removing a portion of the second electrode corresponding to the second region.

7. The organic light emitting display device as claimed in claim 6, wherein the transmissive window of one unit pixel is connected to the transmissive window of another adjacent unit pixel.

8. The organic light emitting display device as claimed in claim 6, wherein, with respect to four adjacent unit pixels of the plurality of unit pixels, the transmissive window of one unit pixel is connected to the transmissive window of another adjacent pixel.

9. The organic light emitting display device as claimed in claim 1, wherein each of the TFTs and a corresponding one of the first electrodes are in an overlapping relationship with each other.

10. The organic light emitting display device as claimed in claim 1, wherein:

the first region of each unit pixel includes an emissive region and a circuit region, each of the TFTs is disposed in the circuit region of a corresponding unit pixel, and each of the first electrodes is disposed in the emissive region of a corresponding unit pixel.

11. The organic light emitting display device as claimed in claim 10, further comprising a wiring portion electrically connecting the emissive region and the circuit region, wherein the wiring portion is disposed outside an edge portion of the second region.

12. The organic light emitting display device as claimed in claim 1, wherein the emissive region and the circuit region of each unit pixel are adjacent to each other.

13. The organic light emitting display device as claimed in claim 1, further comprising:

a passivation layer covering the TFTs; and a pixel definition layer formed on the passivation layer and covering edge portions of the first electrodes.

14. The organic light emitting display device as claimed in claim 13, wherein the passivation layer includes an opening with respect to each unit pixel, the opening corresponding to the second region.

15. The organic light emitting display device as claimed in claim 1, further comprising a buffer layer formed on the substrate.

16. The organic light emitting display device as claimed in claim 15, wherein the buffer layer includes an opening corresponding to the second region.

17. An organic light emitting display device, comprising:

a substrate;

a plurality of unit pixels on the substrate, each unit pixel including a first region that emits light and a second region that transmits external light, and wherein, with respect to two adjacent pixels of the plurality of unit pixels, the first region and the second region in one unit pixel are symmetrical with the first region and the second region in another adjacent unit pixel, and the second regions are connected to each other;

a plurality of thin film transistors (TFTs) disposed in the first region of each unit pixel;

a plurality of first electrodes disposed in the first region of each unit pixel, each first electrode being electrically connected to one of the TFTs;

a second electrode facing the plurality of first electrodes and commonly disposed in the unit pixels;

an organic layer interposed between the first electrodes and the second electrode, and including an emissive layer;

a pixel definition layer covering edge portions of the first electrodes and including an opening with respect to each unit pixel, the opening corresponding to the second region.

18. The organic light emitting display device as claimed in claim 17, wherein the opening of the pixel definition layer of one unit pixel is connected to the opening of the pixel definition layer of another adjacent unit pixel.

19. The organic light emitting display device as claimed in claim 17, wherein, with respect to four adjacent unit pixels of the plurality of unit pixels, the opening of the pixel definition layer of one unit pixel is connected to the opening of the pixel definition layer of another adjacent unit pixel.

* * * * *